(12) United States Patent
Krames et al.

(10) Patent No.: US 7,863,631 B2
(45) Date of Patent: Jan. 4, 2011

(54) AlINGAP LED HAVING REDUCED TEMPERATURE DEPENDENCE

(75) Inventors: Michael R. Krames, Mountain View, CA (US); Nathan F. Gardner, Sunnyvale, CA (US); Frank M. Steranka, San Jose, CA (US)

(73) Assignees: Koninklijke Philips Electronics N.V., Eindhoven (NL); Philips Lumileds Lighting Company, LLC, San Jose, CA (US)

( * ) Notice: Subject to any disclaimer, the term of this patent is extended or adjusted under 35 U.S.C. 154(b) by 0 days.

(21) Appl. No.: 12/433,106

(22) Filed: Apr. 30, 2009

(65) Prior Publication Data
US 2009/0230381 A1 Sep. 17, 2009

Related U.S. Application Data

(62) Division of application No. 11/100,080, filed on Apr. 5, 2005, now Pat. No. 7,244,630, and a division of application No. 11/672,003, filed on Feb. 6, 2007, now Pat. No. 7,544,525.

(51) Int. Cl.
*H01L 33/00* (2010.01)
*H01L 29/221* (2010.01)
*H01L 29/225* (2010.01)

(52) U.S. Cl. .................... 257/96; 257/97; 257/E33.024
(58) Field of Classification Search .................. 257/96, 257/97, E33.024
See application file for complete search history.

(56) References Cited

U.S. PATENT DOCUMENTS

| 5,319,223 A | 6/1994 | Fujita et al. |
| 5,321,712 A | 6/1994 | Itaya et al. |
| 5,376,580 A | 12/1994 | Kish et al. |
| 5,439,843 A | 8/1995 | Sakaguchi et al. |
| 6,072,196 A | 6/2000 | Sato |

(Continued)

FOREIGN PATENT DOCUMENTS

EP 0602671 A2 6/1994

(Continued)

OTHER PUBLICATIONS

Abstract of Japanese Patent No. JP8306957, Publication Date: Nov. 22, 1996 1 page.

(Continued)

*Primary Examiner*—Ngan Ngo

(57) ABSTRACT

To increase the lattice constant of AlInGaP LED layers to greater than the lattice constant of GaAs for reduced temperature sensitivity, an engineered growth layer is formed over a substrate, where the growth layer has a lattice constant equal to or approximately equal to that of the desired AlInGaP layers. In one embodiment, a graded InGaAs or InGaP layer is grown over a GaAs substrate. The amount of indium is increased during growth of the layer such that the final lattice constant is equal to that of the desired AlInGaP active layer. In another embodiment, a very thin InGaP, InGaAs, or AlInGaP layer is grown on a GaAs substrate, where the InGaP, InGaAs, or AlInGaP layer is strained (compressed). The InGaP, InGaAs, or AlInGaP thin layer is then delaminated from the GaAs and relaxed, causing the lattice constant of the thin layer to increase to the lattice constant of the desired overlying AlInGaP LED layers. The LED layers are then grown over the thin InGaP, InGaAs, or AlInGaP layer.

27 Claims, 10 Drawing Sheets

U.S. PATENT DOCUMENTS

| | | | |
|---|---|---|---|
| 6,100,544 | A | 8/2000 | Lin et al. |
| 6,107,648 | A | 8/2000 | Shakuda et al. |
| 6,121,112 | A | 9/2000 | Sakaguchi et al. |
| 6,232,138 | B1 | 5/2001 | Fitzgerald et al. |
| 6,236,067 | B1 | 5/2001 | Shakuda et al. |
| 6,274,399 | B1 | 8/2001 | Kem et al. |
| 6,303,405 | B1 | 10/2001 | Yoshida et al. |
| 6,372,609 | B1 | 4/2002 | Aga et al. |
| 6,525,335 | B1 | 2/2003 | Krames et al. |
| 6,528,823 | B2 | 3/2003 | Akaike et al. |
| 6,777,257 | B2 | 8/2004 | Shinohara et al. |
| 6,787,383 | B2 | 9/2004 | Ikeda et al. |
| 6,879,614 | B2 | 4/2005 | Sato |
| 7,008,859 | B2 | 3/2006 | Letertre et al. |
| 7,078,318 | B2 | 7/2006 | Jurgensen et al. |
| 2003/0059972 | A1 | 3/2003 | Ikeda et al. |
| 2003/0089921 | A1 | 5/2003 | Jordan et al. |
| 2003/0219918 | A1 | 11/2003 | Shinohara et al. |
| 2004/0023426 | A1 | 2/2004 | Shinohara et al. |
| 2004/0104396 | A1 | 6/2004 | Nakatsu et al. |
| 2005/0020032 | A1 | 1/2005 | Solanki et al. |
| 2005/0026392 | A1 | 2/2005 | Jurgensen et al. |
| 2005/0230674 | A1 | 10/2005 | Takahashi et al. |
| 2005/0285127 | A1 | 12/2005 | Noto et al. |
| 2006/0060922 | A1 | 3/2006 | Letertre et al. |
| 2006/0102916 | A1 | 5/2006 | Sun et al. |
| 2006/0255341 | A1 | 11/2006 | Pinnington et al. |
| 2008/0054277 | A1* | 3/2008 | Takemi et al. .................. 257/85 |
| 2009/0286342 | A1* | 11/2009 | Takahashi et al. ............. 438/32 |

FOREIGN PATENT DOCUMENTS

| | | |
|---|---|---|
| GB | 2293488 A1 | 3/1996 |
| JP | 08307005 | 11/1996 |

OTHER PUBLICATIONS

Soitec Smart Cut, Innovative Process, 1 page downloaded on Oct. 15, 2004 from http://www.soitec.com/en//techno/t_2_p.html.

L.J. Stinson et al., High-efficiency InGaP light-emitting diodes on GaP substrates, Appl. Phys. Lett.58 (18), May 6, 1991, American Institute of Physics, pp. 2012-2014.

D. Vignaud et al, "Conduction band offset in the $Al_xGa_yIn_{1-x-y}P$/$Ga_{0.48}P$ System as studied by luminescence spectroscopy," Journal of Applied Physics, vol. 93, No. 1, Jan. 1, 2003 American Institute of Physics, pp. 384-389.

H. Morkoc et al., "High Luminosity Blue and Blue-Green Gallium Nitride Light Emitting Diodes," Paper, University of Illinois at Urbana-Champaign, pp. 1-20.

H. Hamada et al, "Room-Temperature CW Operation of 610nm Band AlGaInP Strained Multiquantum Well Laser Diodes With Multiquantum Barrier", vol. 28, No. 19, Sep. 10, 1992.

* cited by examiner

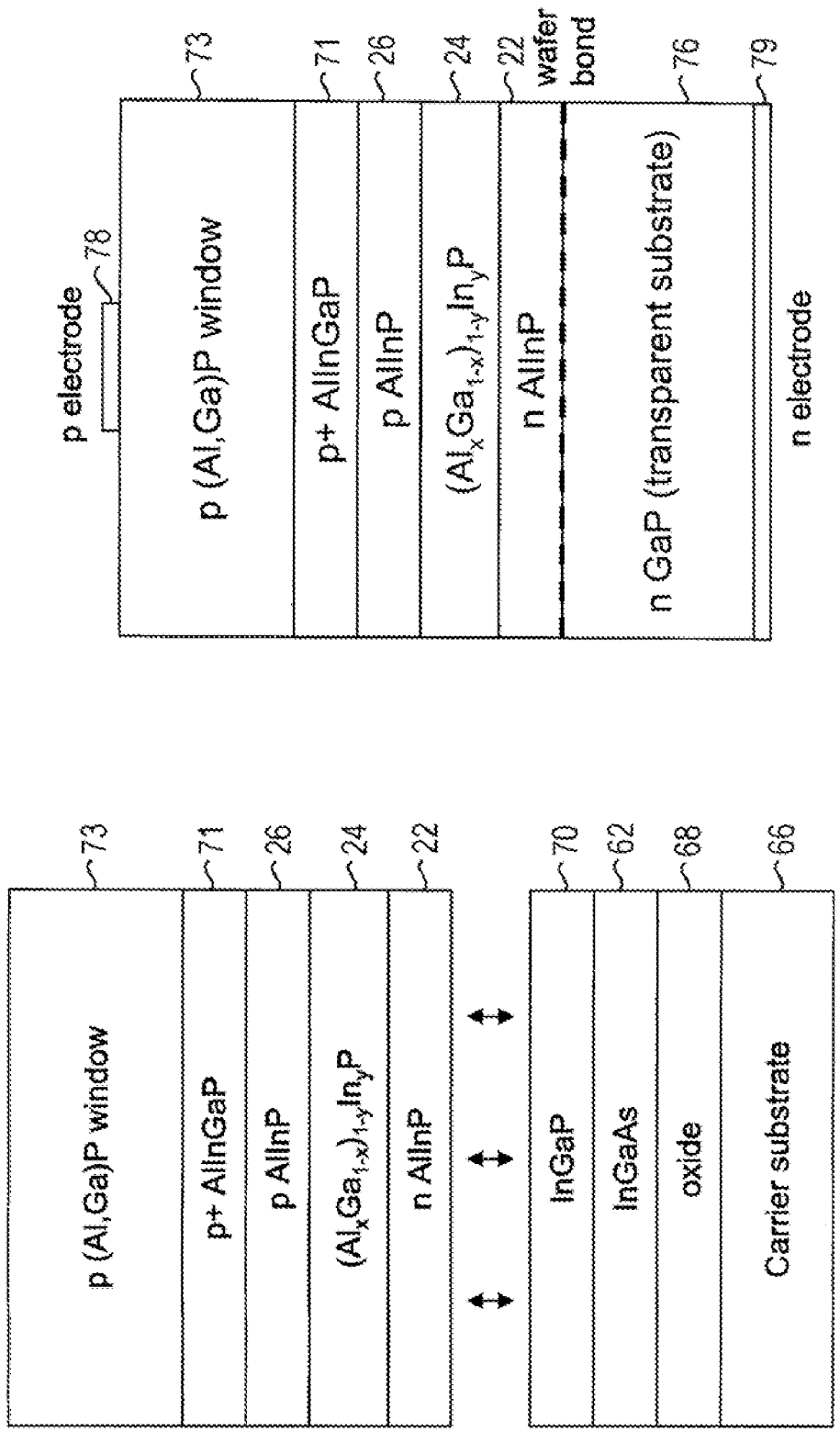

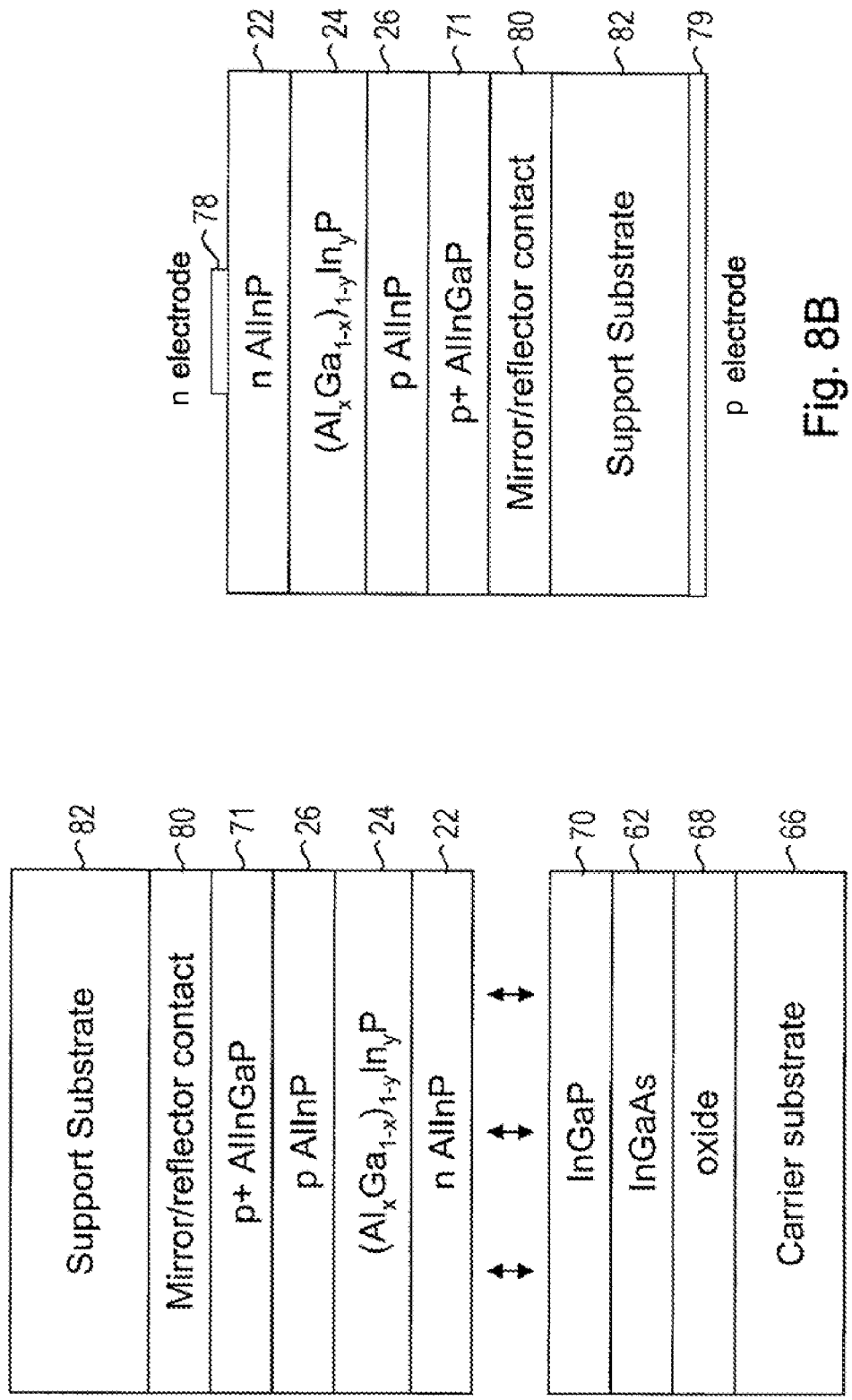

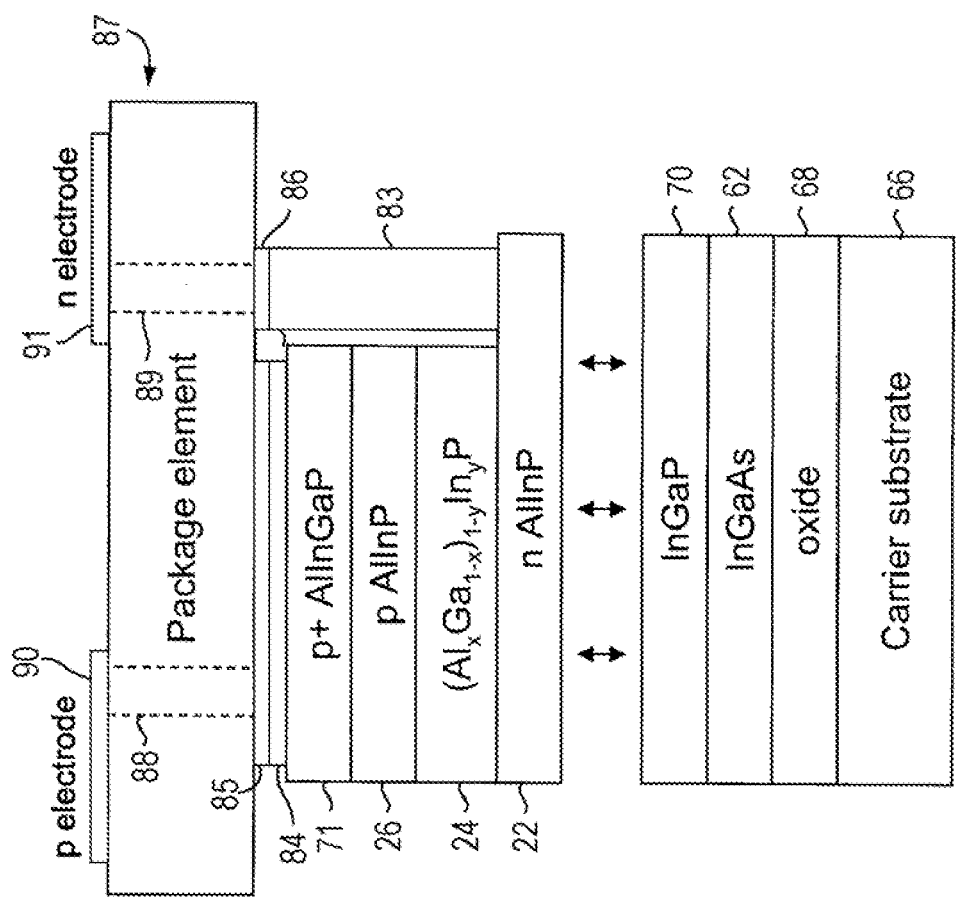
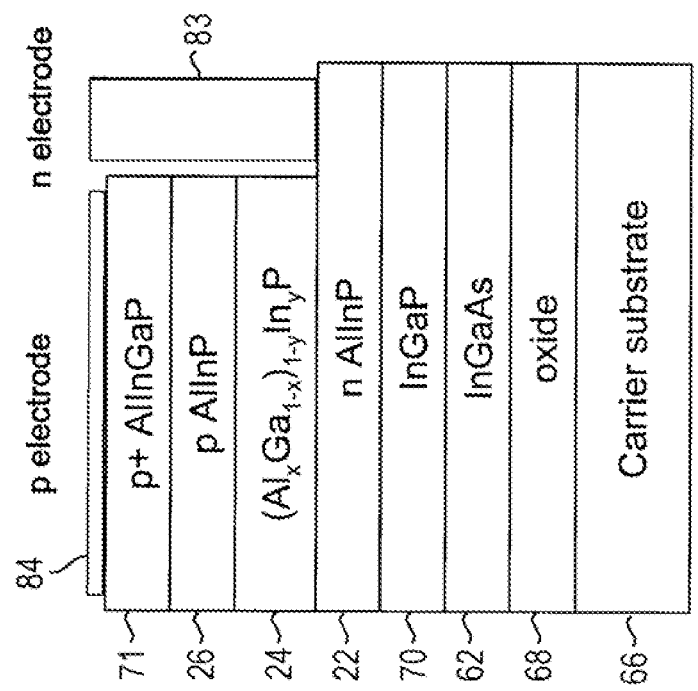

AlINGAP LED HAVING REDUCED TEMPERATURE DEPENDENCE

This application is a Divisional under 35 U.S.C. §121 of U.S. patent application Ser. No. 11/100,080 filed 5 Apr. 2005, which is a Divisional of patent application Ser. No. 11/672,003 filed 6 Feb. 2007 the contents of both of which are incorporated herein by reference.

FIELD OF THE INVENTION

This invention relates to light emitting diodes (LEDs) and, in particular, to a technique for forming AlInGaP LEDs whose visible light output has a reduced temperature dependence.

BACKGROUND $(Al_xGa_{1-x})_{1-y}In_yP$ LEDs are used to produce visible wavelengths from red to amber. AlInGaP LEDs are typically formed by growing epitaxial layers, including p-type and n-type layers sandwiching a light-emitting active layer, on a GaAs growth substrate. High quality ternary and quaternary substrates are very difficult to fabricate, so GaAs substrates are commonly used. To produce low-defect LED layers, the lattice constant of the $(Al_xGa_{1-x})_{1-y}In_yP$ epitaxial layers must match the lattice constant of the GaAs. To match the GaAs lattice constant, y=0.48. The x value is adjusted to achieve the desired emission wavelength.

The light output of AlInGaP LEDs is highly dependent on temperature. For example, at temperatures in the range of 80-120 degrees C., the internal quantum efficiency at useful wavelengths is significantly reduced, resulting in a light output of two-thirds to one-half of the light output at room temperature. This variation in light output is extremely significant in certain applications such as traffic lights, tail lights, and displays.

What is needed is a technique to reduce the temperature sensitivity of AlInGaP LEDs.

SUMMARY

It has been discovered by the Applicants that AlInGaP LEDs have a reduced temperature sensitivity if the lattice constant of the AlInGaP active layer is greater than that of GaAs. The lattice constant may be increased by increasing the percentage of indium. Increasing the lattice constant increases the percentage of direct band gap (vs. indirect band gap) recombination, thus increasing quantum efficiency. However, only GaAs and Ge are practical growth substrates for AlInGaP LEDs, each having a similar lattice constant, approximately 5.65 Å.

To increase the lattice constant of the AlInGaP layers, an engineered growth layer is formed over a substrate, where the growth layer has a lattice constant equal to or approximately equal to the desired AlInGaP epitaxial layers for the light emitting device. In one embodiment, the growth layer has a composition of $(Al_xGa_{1-x})_{1-y}In_yP$, where $0 \leq x \leq 1.0$, and $y > 0.48$.

In one embodiment, a graded InGaAs or, InGaP layer is grown over a GaAs or Ge substrate. The amount of indium is increased during growth of the layer such that the final lattice constant is equal to that for the desired bandgap properties in the AlInGaP active layers. By grading the InGaAs or InGaP layer, the residual strain is relatively low, resulting in an acceptable dislocation density (e.g., <10E6/cm²).

A thick (~5 to 100 um) transparent window layer, for example GaP, AlGaP, or AlGaAs, may be grown above the AlInGaP active LED layers. This layer provides increased light extraction and current spreading for the LED devices. The resulting wafer may be metallized and diced, and mounted into packages, to provide operating LEDs. Alternatively, a distributed-Bragg-reflector (DBR) epitaxial layer stack, for example AlGaAs/AlGaAs, may be grown between the absorbing buffer layers and the LED active region, to reflect downward light towards the top surface of the chip, to increase LED brightness.

In another embodiment, a very thin InGaP, InGaAs, or AlInGaP layer is grown on a GaAs or Ge growth substrate, where the InGaP, InGaAs, or AlInGaP layer is fully strained (compressed) and free of additional dislocations caused by the heteroepitaxy. Hydrogen ions are implanted into the top surface of the growth substrate. The wafer is then bonded to an oxide bonding layer grown on a carrier substrate, which may be Si, Ge, GaAs, or other semiconductor, ceramic or metal, or alloys thereof. The resulting structure is heated, forming hydrogen bubbles that delaminate the InGaP, InGaAs, or AlInGaP layer from the growth substrate. The InGaP, InGaAs, or AlInGaP layer then relaxes so that its lattice constant increases. The oxide bonding layer is optional if the wafer bond allows the strained layer to expand. The indium content is selected such that the released InGaP, InGaAs, or AlInGaP layer has the same lattice constant as the desired overlying AlInGaP epitaxial layers. The AlInGaP LED layers are then grown over the relaxed InGaP, InGaAs, or AlInGaP layer. Subsequently, the LED layers may be bonded to a final host substrate or package element, and the carrier substrate and oxide layer are removed, for example, by etching or lapping, or any combination thereof. Light extraction features, such as shapes or texturing (either random or ordered), or a photonic crystal structure, may be applied to the top surface of the LED structure. Electrical contacts are made to the LED layers, and the wafer is diced. The resulting chips are mounted into packages to provide operating LEDs. The same device fabrication method could be applied to the technique of using InGaP or InGaAs graded buffer layers, described above.

Alternatively, a thick (~5 to 100 um) transparent window layer, for example GaP, AlGaP, or AlGaAs, may be grown above the AlInGaP LED layers. Then, the carrier substrate and oxide layer may be removed, with mechanical support for the remaining structure provided by the thick window layer. The resulting structure may be bonded to a conductive, transparent substrate, such as GaP using elevated temperature and pressure. The wafer bonding conditions may be chosen so that the bonded interface provides both good electrical conductivity as well as optical transparency. The resulting wafer may be metallized and diced, and mounted into packages, to provide fully transparent LEDs. The same device fabrication method could be applied to the technique of using InGaP or InGaAs graded buffer layers.

Accordingly, Applicants have invented an AlInGaP LED with base LED epitaxial layers having an enlarged lattice constant. The enlarged lattice constant desirably affects the properties of the AlInGaP active layer. The AlInGaP active layer may even have a composition such that it is stressed or strained, since its lattice constant is constrained to the enlarged lattice constant of the epitaxial growth layers. The active layer may be multiple layers including quantum wells.

BRIEF DESCRIPTION OF THE DRAWINGS

FIGS. 7A-7B are cross-sectional views of another LED structure at various stages of manufacture where a thick top window is formed (after the step of FIG. 6F), and the light absorbing carrier substrate (e.g., silicon), along with other layers, are removed and optionally replaced with a transparent substrate.

FIGS. 8A-8B are cross-sectional views of another LED structure at various stages of manufacture where a reflector (e.g., metal mirror or Bragg reflector) and support substrate are bonded over the p-layers, and the light absorbing carrier substrate (e.g., silicon), along with other layers, are removed.

FIGS. 9A-9C are cross-sectional views of another LED structure at various stages of manufacture where the device is formed as a flip chip, with the light absorbing carrier substrate (e.g., silicon) and other layers removed, and the top surface of the chip further processed (e.g., roughened) to for light extraction features.

DETAILED DESCRIPTION

Figure 1A:
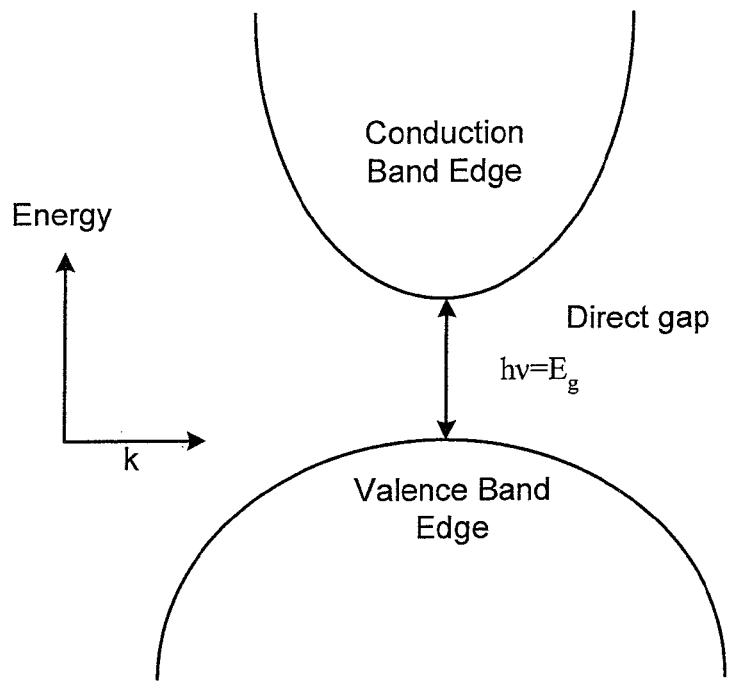
FIGS. 1A and 1B are diagrams showing examples of a conduction band edge and valence band edge that provides a direct band gap for efficiently producing light.
Figure 1B:
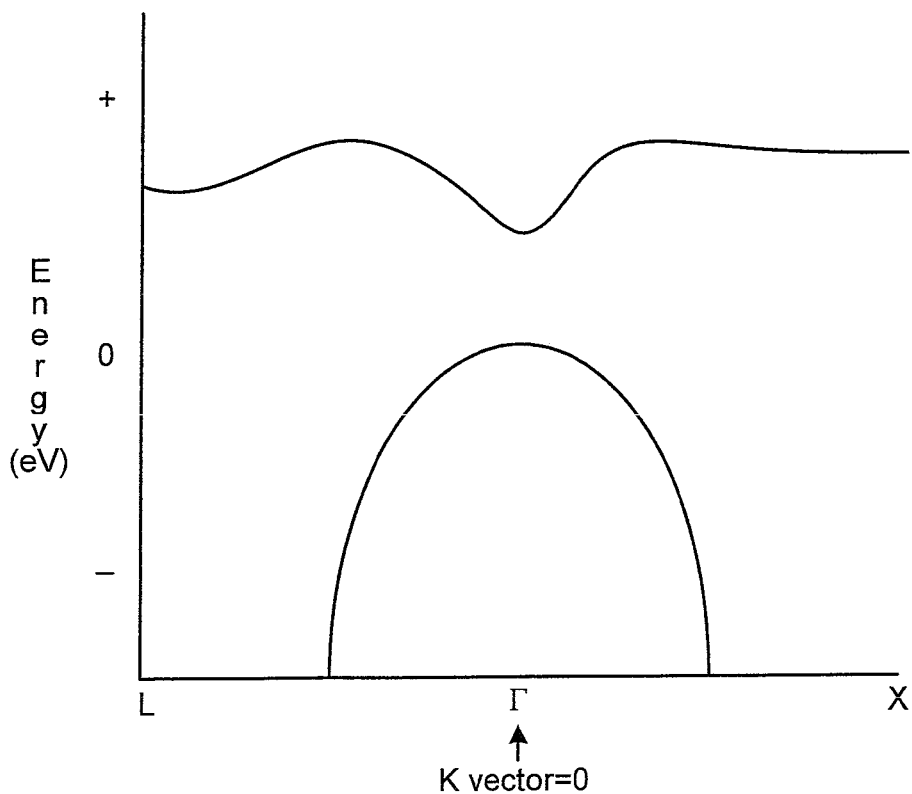

In direct band gap semiconductors, light can be efficiently generated because the maximum energy level in the valence band and the minimum energy level in the conduction band occur at the same k-vector. FIG. 1A is a simplified representation of energy vs. k-vector for a direct band gap semiconductor material, where the valence band maximum has the same k-vector as the conduction band minimum. In reality, the energy vs. k-vector curves are not as simple. FIG. 1B is an energy vs. k-vector diagram for a direct band gap zinc blende semiconductor showing a direct band gap minimum ($\Gamma$) and indirect band gap minima (L and X) for the conduction band. The $\Gamma$ minimum must be at a lower energy than the L or X minima for an electron to efficiently cross the gap between the valence band and the conduction band to create a direct band gap transition and produce light. If the X or L minima were at an energy level lower than the $\Gamma$ energy level, an increased carrier population would be involved in an indirect band gap transition and not produce light.

Applicants have discovered the following three reasons for the poor thermal performance of an $(Al_xGa_{1-x})_{1-y}In_yP$ LED, where y=0.48 to match the lattice constant of the GaAs growth substrate:

1. The carrier population at the L minimum increases with temperature, causing fewer electrons to be involved in direct band gap transitions;
2. There is increased electron leakage with increasing temperature from the AlInGaP active layer over the relatively shallow conduction band barrier provided by the p-type AlInP:Mg upper confining layer; and
3. There is a reduced percentage of radiative recombination with increasing temperature due to increased nonradiative Hall-Shockley-Reed recombination, which is more active at elevated temperatures.

Applicants have determined that reason #1 above dominates the temperature sensitivity. Each of the above problems is exacerbated as the Al content (i.e., x) of the active layer increases. Increasing x is necessary to shorten the emission wavelengths from 650 nm (deep red) to 560 nm (yellow/green). Further, a higher Al content is needed for efficient photometric operation at elevated temperatures, since thermal lattice expansion leads to a significant red-shift in emission peak wavelength (~0.1-0.2 nm/K).

Applicants have analyzed the carrier concentration and distribution, emission wavelength, quantum efficiency, and temperature dependence of $(Al_xGa_{1-x})_{1-y}In_yP$ LEDs for different lattice constants and discovered that a small energy separation between the $\Gamma$ and L minima (~110 meV) for this material system causes the L minima to dominate the temperature dependence of red (~630 nm) LEDs. In other words, a high electron population in the indirect L minima is the dominant factor in the temperature dependence of $(Al_xGa_{1-x})_{1-y}In_yP$ LEDs.

Accordingly, Applicants sought a way to increase the energy separation between the $\Gamma$ and L minima in the active region to reduce the percentage of indirect band gap transitions with increasing temperature and thus reduce the temperature dependence of $(Al_xGa_{1-x})_{1-y}In_yP$ LEDs.

Applicants have discovered that an enlarged-lattice constant AlInGaP active layer substantially reduces the temperature dependence of the LED by increasing the energy separation between the $\Gamma$ and L minima. As previously mentioned, y in conventional LEDs is set to 0.48 in order for the material to match the lattice constant of the GaAs growth substrate so as to have relatively few dislocation defects. A higher value of y would result in the LED material grown on the GaAs substrate to have an unacceptably high density of dislocations.

In one embodiment of the invention, Applicants form an LED using epitaxial layers of $(Al_xGa_{1-x})_{1-y}In_yP$, where y=0.53, which has a lattice constant greater than GaAs. To achieve the target red emission (~630 nm), an increase in Al content may be required (to ~20% for y=0.53, compared to ~8% for y=0.48). Other $(Al_xGa_{1-x})_{1-y}In_yP$ materials, where y>0.48, may also be engineered to have a desired large lattice constant to reduce the temperature dependence.

Figure 2:
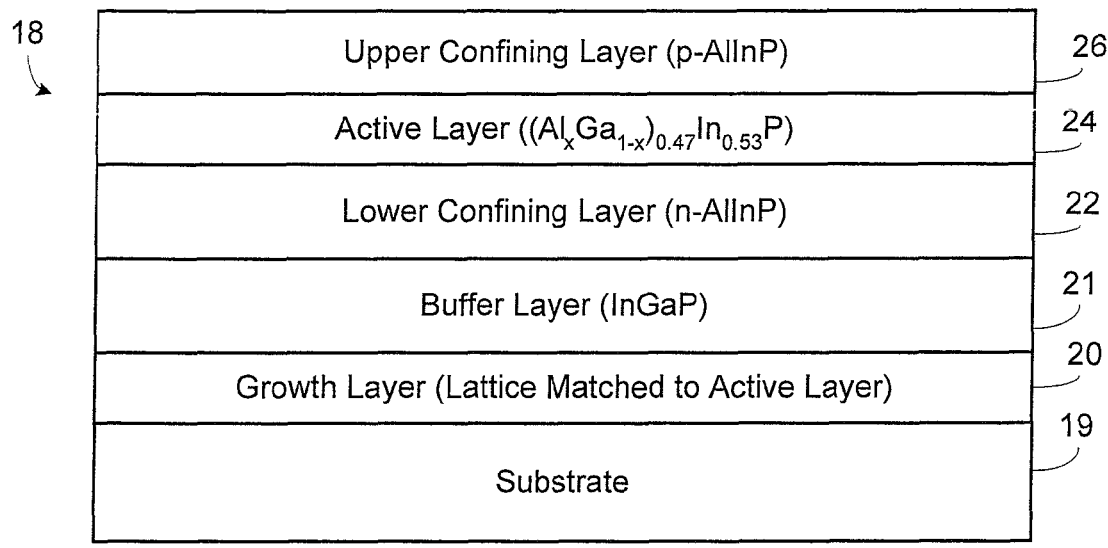
FIG. 2 is a cross-sectional view of an AlInGaP LED having an enlarged lattice constant formed by engineering a growth layer having a lattice constant greater than that of GaAs and equal to the lattice constant of the desired AlInGaP layers.

FIG. 2 is a cross-sectional view of one embodiment of an LED 18 where the active layer has a composition of $(Al_xGa_{1-x})_{0.47}In_{0.53}P$ (lattice constant is larger than that of GaAs). In FIG. 2, a substrate 19 has a growth layer 20 formed thereon. Various engineered growth layers and substrates are described below for growing the LED layers. The growth layer 20 has the same or approximately the same lattice constant as the overlying layers, including the active layer. An InGaP buffer layer 21 is grown over the growth layer 20. A lower confining layer 22 of n-type AlInP is grown on the buffer layer 21. The AlInP confining layer 22 has a band gap that is higher than the band gap of the active layer. An active layer 24 of $(Al_xGa_{1-x})_{0.47}In_{0.53}P$, which may comprise a plurality of layers, is grown over the confining layer 22. A p-type upper confining layer 26 of AlInP is grown over the active layer 24. A highly doped p-type AlInGaP contact layer may be provided over layer 26. A p-metal electrode and an n-metal electrode are formed in electrical contact with the p and n-type confining layers, respectively, for forward biasing the LED and injecting electrons and holes into the active layer 24 for radiative recombination.

The Al content in the active layer 24 is selected for the desired visible wavelength (e.g., red through green).

The relatively large lattice constant of the AlInP confining layers causes the band gap energy of the confining layers to slightly decrease (e.g., by ~12 meV) as compared to AlInP with a lattice constant equal to that of GaAs. Although this reduces the effectiveness of the confining layers in confining the injected carriers to the active layer, the increased direct band gap recombination due to the larger lattice constant of the active layer more than offsets this drawback.

Figure 3:
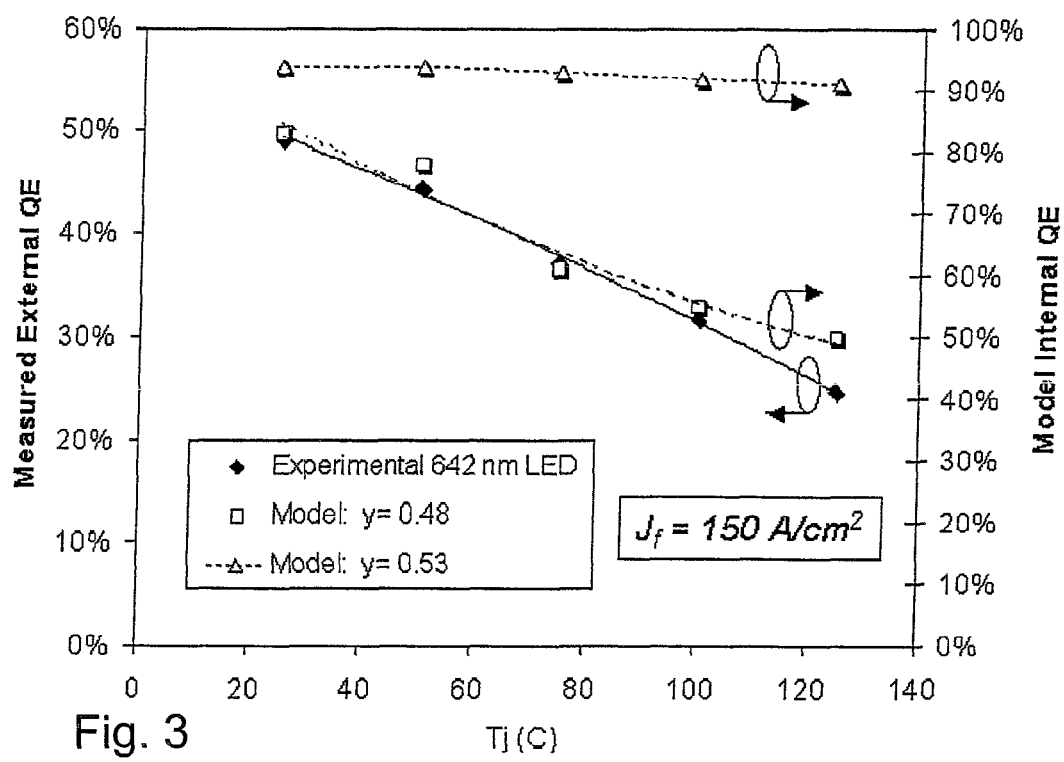
FIG. 3 is a diagram showing the reduced temperature dependence of a $(Al_xGa_{1-x})_{1-y}In_yP$ LED when y has been increased from 0.48 (matched to GaAs) to 0.53.

FIG. 3 is a graph showing the predicted reduced temperature dependence of the $(Al_xGa_{1-x})_{1-y}In_yP$ LED when y has been increased from 0.48 to 0.53. The external and internal quantum efficiencies are plotted vs. the p-n junction temperature.

The composition of the AlInGaP active layer need not be selected to precisely match that of the enlarged-lattice constant of the other AlInGaP epitaxial layers in the stack (e.g., y in the active layer need not equal y in the underlying layers). For example, if the AlInGaP active layer is very thin (or formed of a plurality of thin layers), the composition of the AlInGaP active layer may be selected such that the active layer is stressed or strained, without having unacceptable defects, since its lattice constant is constrained to the enlarged lattice constant of the epitaxial growth layers beneath. That is, the active light emitting layers or other layers within the active region may be provided under tensile or compressive strain with respect to the underlying AlInGaP epitaxial layers.

Figure 4:
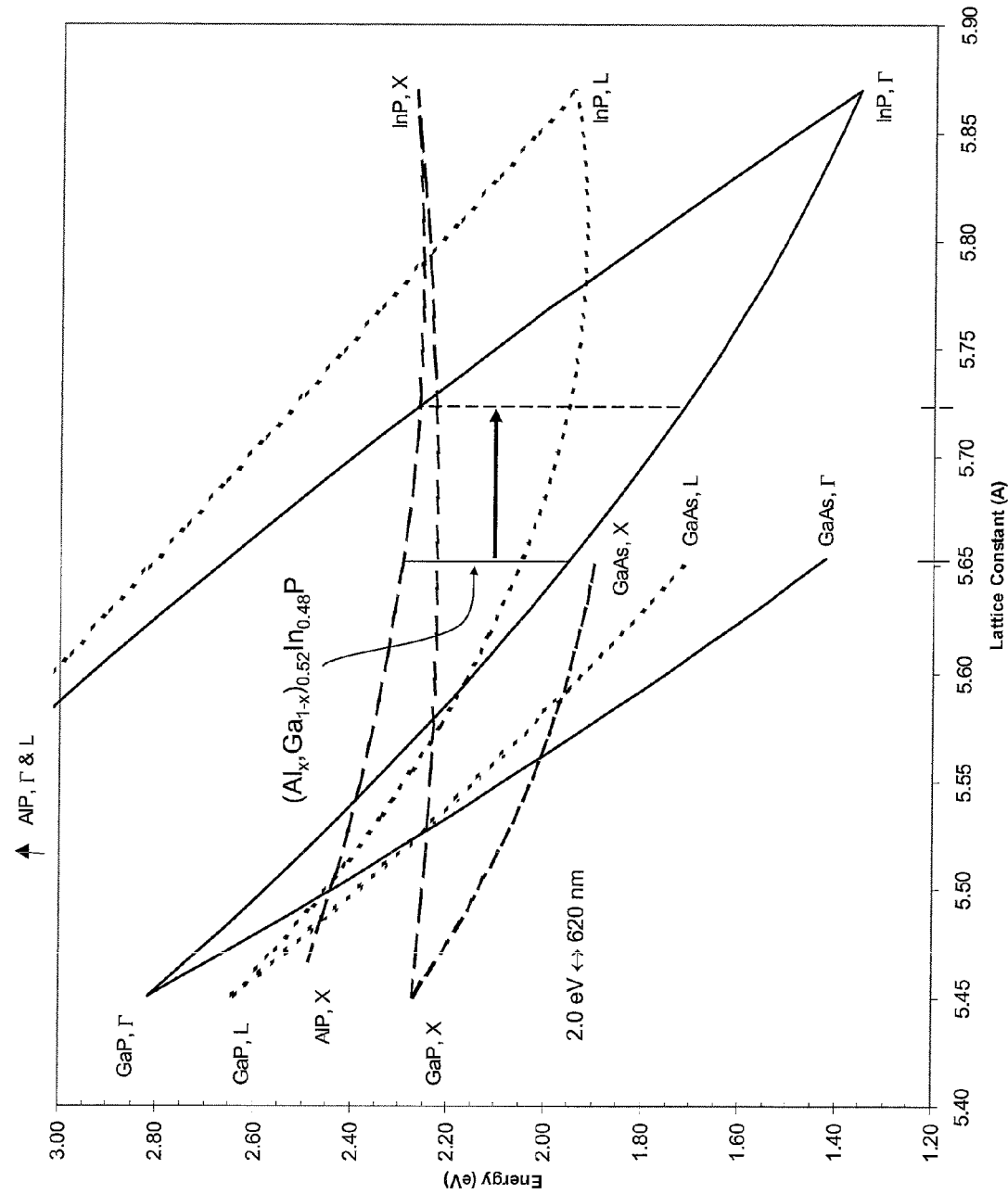
FIG. 4 is a diagram of lattice constant vs. energy gap for various substrates, including GaAs, illustrating the Applicants' desired increase in the lattice constant of AlInGaP LED layers from 5.65 angstroms (the lattice constant of GaAs) to between 5.65 and 5.73 Å to reduce the temperature sensitivity of the AlInGaP LED.

FIG. 4 is a diagram of energy gap vs. lattice constant for constituent materials that make up the $(Al_xGa_{1-x})_{1-y}In_yP$ system. The lattice constant of the preferred AlInGaP material is greater than 5.65 Å and less than about 5.73 Å. This corresponds to a region from y>0.48 to y<0.66 if the AlInGaP active layer is not stressed or strained.

Figure 5:
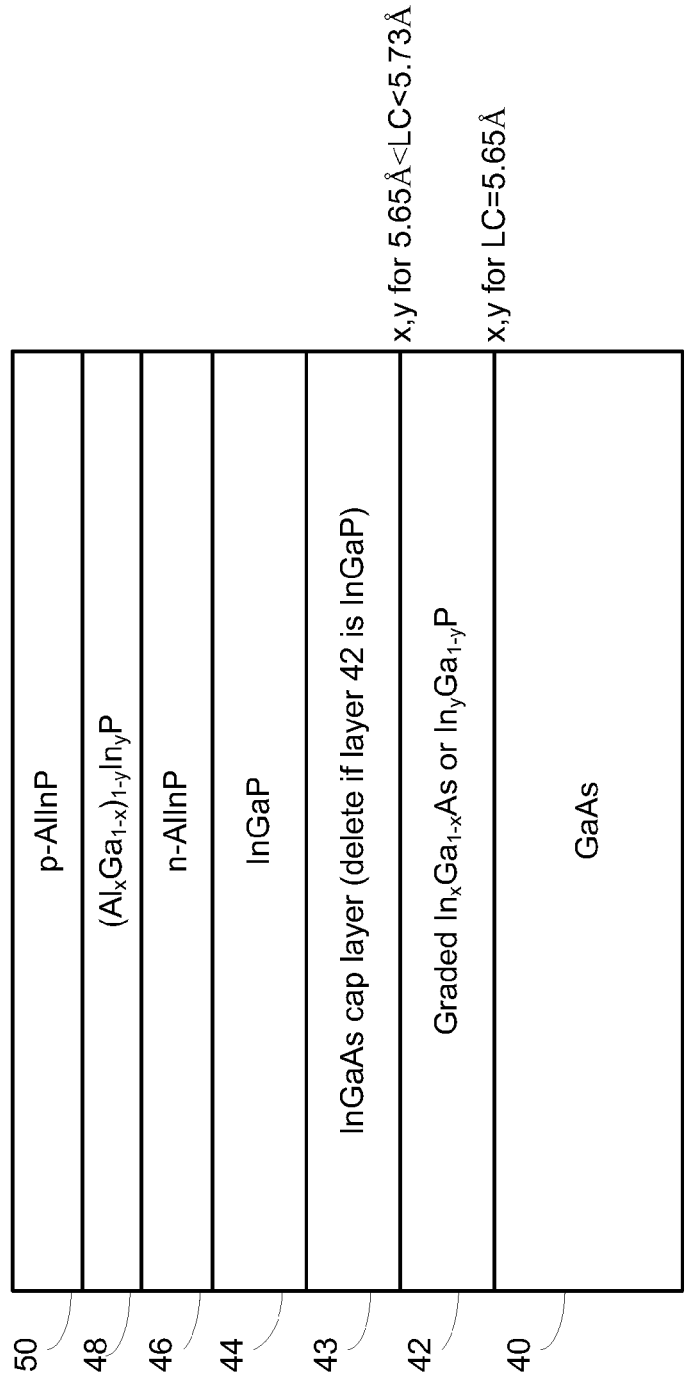
FIG. 5 is a cross-sectional view of an AlInGaP LED having an enlarged lattice constant grown over a graded InGaAs or InGaP layer.

FIG. 5 illustrates one method to form an AlInGaP active layer with a lattice constant greater than that of GaAs. FIG. 5 shows a cross-sectional view of a starting GaAs substrate 40, having a lattice constant of 5.65 Å. To create a growth layer with a larger lattice constant (e.g., up to 5.73 Å), a graded $In_xGa_{1-x}As$ buffer layer 42 is grown on the GaAs substrate 40 until the lattice constant is the same as that desired for the AlInGaP LED layers. In one example, x is graded from 0 to 0.08 over a thickness of approximately 1 micron to achieve a lattice constant of 5.69 Å. A maximum x is about 0.18. An x of 0.18 will achieve a lattice constant of about 5.73 Å.

In another embodiment, the graded layer is $In_yGa_{1-y}P$, with indium starting at y=0.48 and increasing up to 0.66. A y of 0.66 will achieve a lattice constant of about 5.73 Å. Details of growing a graded layer are found in U.S. Pat. No. 6,232,138, incorporated herein by reference, which describes engineering a growth layer for forming light emitting layers with new material systems, in particular AlInGaAs infrared lasers and transistors. In the present invention, the reason for engineering the growth layer is not for a new material system but for improved temperature sensitivity for a commonly used material system.

To reduce residual strain, the percentage of In increases to a point slightly below the top surface of the graded layer then is reduced by a small amount for the remainder of the thickness to achieve the intended lattice constant at the top surface.

After the desired $In_xGa_{1-x}As$ buffer layer is grown to enlarge the lattice constant, a uniform cap layer 43 of InGaAs (or InGaP) may be grown to reduce defect density. The uniform layer 43 may have an In composition slightly less than that of the maximum In composition achieved within the graded buffer layer 42. An InGaP buffer layer 44 is then grown followed by an n-type AlInP confining layer 46. If the graded buffer layer 42 is $In_yGa_{1-y}P$, the cap layer 43 may be the InGaP buffer layer 44. A light-emitting AlInGaP LED active layer 48 is then grown having the desired enlarged lattice constant, such as $(Al_xGa_{1-x})_{0.47}In_{0.53}P$ for emitting visible red light or shorter wavelengths. The suitable indium content in the active layer for a particular growth layer (e.g., cap or graded layer) may have a range, as opposed to only a single suitable amount, if a strained or stressed active layer is acceptable. In one embodiment, the wavelength is between 630 nm (red) and 560 nm (green). A p-type AlInP upper confining layer 50 is then grown. A highly doped p-type (Al,In,Ga)P contact layer may then be provided over layer 50. Other compositions of confining layers may also be used.

Optionally, a thick (~5 to 100 um) transparent window layer, for example GaP, AlGaP, or AlGaAs, may be grown above the AlInGaP LED layers. This layer provides increased light extraction and current spreading for the LED devices, and is not required to be latticed matched to the underlying layers.

Suitable n and p metal contacts are then formed on the top and bottom surfaces. The wafer is diced, and chips are mounted into packages to form operable LEDs. One method of forming an AlInGaP LED is described in U.S. Pat. No. 6,525,335 to Krames et al., incorporated herein by reference.

The lattice constant of the LED layers may differ slightly from that of the uniform cap layer 43 without incurring unacceptable defects.

If the GaAs substrate 40 and graded InGaAs layer 42 (or graded InGaP layer) are to be used for conducting current to the n side of the pn junction, those materials would be n-doped. Alternatively, the light-absorbing GaAs and InGaAs materials may be removed and replaced by a transparent substrate bonded below the lower confining layer 46. In this case, a fully transparent LED chip is possible. In one embodiment, the p and n layers are electrically contacted by metal layers on the same side of the chip to form a flip chip, where the p and n-metal contacts are then directly bonded to a submount. A flip chip is described in U.S. Pat. No. 6,274,399 to Kern et al., incorporated herein by reference. The LED chips may be shaped to provide increased light extraction.

FIGS. 6A-6F illustrate an alternative method to engineer a growth layer having a lattice constant matched to the lattice constant of the desired active layer composition, such as $(Al_xGa_{1-x})_{0.47}In_{0.53}P$. As previously mentioned, the suitable indium content of thin layers within the LED epitaxial structure may be within a range while still allowing the thin layers to have approximately the same lattice constant as the base epitaxial layers and growth layer. That is, such thin layers may be under tensile or compressive strain. A particular example is the use of a reduced-In active light emitting layer or layers in order to provide a reduction in the required Al content of such layers for producing a certain wavelength of light.

Figure 6A:
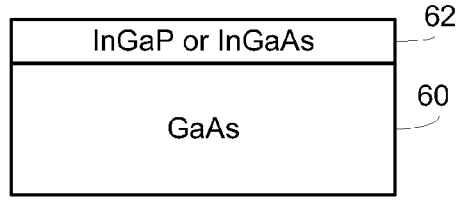
FIGS. 6A-6F are cross-sectional views of an LED structure at various stages of manufacture when forming an engineered growth layer, having a lattice constant larger than the lattice constant of GaAs, and growing AlInGaP epitaxial layers on the growth layer.

In FIG. 6A, a GaAs substrate 60 (lattice constant=5.65 Å) has grown over it by MOCVD or MBE a very thin layer of InGaP or InGaAs 62. The indium content of layer 62 is selected so that, if layer 62 were released from the GaAs substrate 60, its lattice constant would be greater than 5.65 Å, and preferably in the range of 5.66 to 5.73 Å. This lattice-match requirement corresponds to a range of $0.48 < y < 0.66$ for $In_yGa_{1-y}P$, and $0 < x < 0.18$ for $In_xGa_{1-x}As$. The thickness of this layer is chosen to be low enough so that it is below the critical thickness where dislocations would be generated. In one embodiment, the composition of layer 62 is $In_{0.18}Ga_{0.82}As$ and its thickness is about 100 Å. By growing a very thin InGaP or InGaAs layer 62, the layer is strained (compressed) to have a lattice constant of 5.65 Å but there are few defects. Thicknesses greater or less than 100 angstroms may be used as long as the defect densities are within an acceptable range (i.e., critical thickness limitation not exceeded).

Figure 6B:
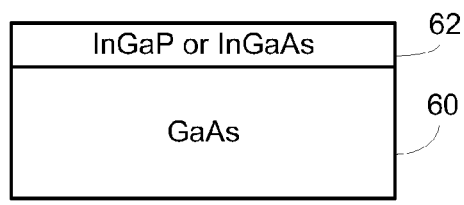

In FIG. 6B, hydrogen 64 is implanted into the top surface of the GaAs substrate 60 in order to form a bubble layer. In one embodiment, H+ ions are implanted with an energy of 125 keV with an implantation dose of $8 \times 10E16/cm^2$.

Figure 6C:
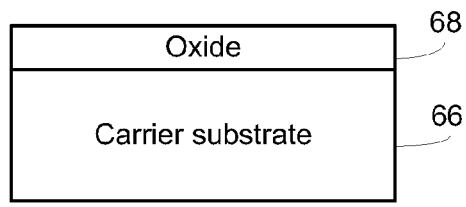

In FIG. 6C, a carrier substrate 66 (e.g., silicon) has an oxide bonding layer 68 formed (thermally grown or deposited) on its surface to a thickness of about 0.1 to 2 microns. The carrier substrate 66 may be any material, including a transparent substrate.

Figure 6D:
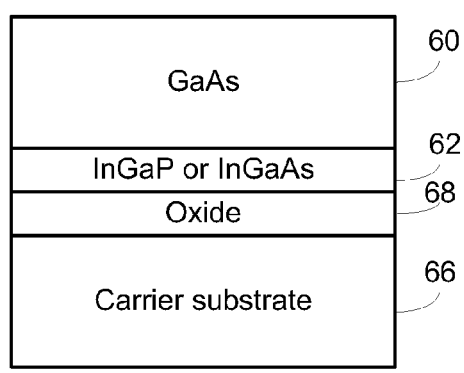

In FIG. 6D, the two wafers are brought into contact, and the InGaP or InGaAs layer 62 is bonded to the oxide layer 68 layer. If the layer 62 and oxide layer 68 are sufficiently flat, the two layers will bond at an elevated temperature under pressure.

Figure 6E:
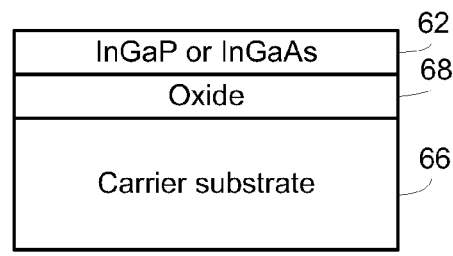

In FIG. 6E, the bonded wafers are heated to about 500 degrees C. or higher in an inert atmosphere to cause the hydrogen gas to expand and delaminate the thin InGaP or InGaAs layer 62 from the GaAs substrate 60. Since the oxide 68 is not rigid, the layer 62 will relax (expand) to increase to its relaxed lattice constant between 5.66 and 5.73 Å. The remaining structure becomes a new growth substrate, with a new (different) lattice constant compared to the original GaAs substrate.

The oxide bonding layer 68 is optional if the wafer bonded interface allows the InGaP or InGaAs layer 62 to sufficiently relax.

Figure 6F:
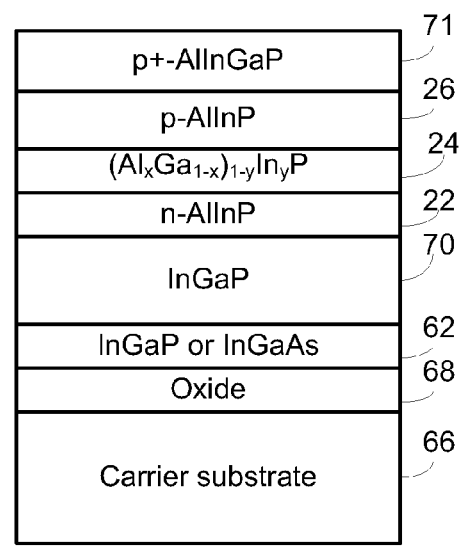

In FIG. 6F, the thin InGaP or InGaAs buffer layer 62 is optionally extended by growth (to stabilize the layer 62) followed by growing an n-type InGaP buffer layer 70, whose In amount is selected to create a lattice-matched buffer layer. Other compositions may be suitable for the buffer layer. AlInGaP LED confining and active layers 22, 24, 26 (previously described with respect to FIGS. 2 and 5) are grown on the buffer layer 70, whereby the AlInGaP active region 24 is lattice matched to the InGaP or InGaAs layer 62 (acting as a substrate). Some layers, especially within the active region, may be slightly under tensile or compressive strain. An optional highly doped AlInGaP p contact layer 71 may be provided above the p confining layer.

One or more of the carrier substrate 66, oxide layer 68, and growth and buffer layers 62 and 70 (which typically absorb light) may be removed by, for example, etching, grinding, or lapping, along with other layers, and a transparent substrate (e.g., GaP or SiC) may be bonded to the n-layer 22 using heat and pressure. Bonding a transparent substrate is described in U.S. Pat. No. 5,376,580 to Kish et al., incorporated by reference.

While the above embodiments specify InGaP or InGaAs as the growth layer 62, it is also possible to have the growth layer be AlInGaP. In fact, it is possible to choose a composition of AlInGaP that provides the desired lattice constant while also remaining transparent to light emitted from active layer 24. When this is the case, carrier substrate 66 may also be chosen to be transparent (suitable substrates include GaP, sapphire, SiC, etc.). In such a case, the substrate, oxide, and growth layers may remain in the device structure, and the LED can be fabricated as a flip-chip device with light collected through the transparent substrate (e.g., FIG. 9B but without the separation of layers 66, 68, 62, 70).

The lift-off technique of FIGS. 6A-6F may also be used in III-V material systems (e.g., GaN) to engineer growth layers having desirable lattice constants.

FIG. 7A illustrates the structure of FIG. 6F with a thick (~5 to 100 um) transparent window layer 73, for example GaP, AlGaP, or AlGaAs, grown above the p+ AlInGaP contact layer 71. This layer 73 provides increased light extraction and current spreading for the LED device. To further improve light extraction, the light-absorbing carrier substrate 66, oxide layer 68, InGaAs layer 62, and InGaP layer 70 are removed by lapping, grinding, etching or other suitable process. As shown in FIG. 7B, a transparent substrate 76 (e.g., n-GaP) is then bonded to the n-AlInP layer 22 using pressure and heat. A p-electrode 78 is then formed on the conductive window layer 73, and an n-electrode 79 is formed on the conductive transparent substrate 76. In one embodiment, the n-electrode 79 includes a reflective layer (e.g., Au or Ag) so as to act as a mirror to reflect light through the window layer 73. The p-electrode 78 is formed so as to not block a significant amount of light. The p-electrode 78 may be made transparent by forming a very thin layer of metal (e.g., gold), or the p-electrode 78 may be formed to take up little surface area.

FIGS. 8A and 8B illustrate an embodiment, where, instead of forming a window layer, a reflective layer is formed, identified as mirror/reflective contact 80. Mirror/reflective contact 80 may be a reflective metal, such as silver, or a distributed Bragg reflector (DBR). A support substrate 82 is wafer-bonded to the layers. The support substrate 82 may be any conductive material with a suitable thermal coefficient such as GaAs, Si, GaP, SiC, or metals such as molybdenum, copper, copper-tungsten or other metals or alloys thereof. The metal mirror may be deposited on the LED layers, or the metal mirror may first be deposited on the support substrate 82 prior to wafer-bonding. Suitable p and n electrodes 78, 79 are then formed. The mirror/reflective contact 80 reflects light upwards and out of the LED to increase light extraction.

Instead of grinding, lapping, or etching away the carrier substrate 66, a lift-off technique may be used. In such a process, the oxide layer 68 is etched using a wet etchant, such as HF, to lift off the overlying structure.

Lift-off materials other than oxide may be used. A silicon-on-insulator (SOI) technique using implanted hydrogen as a delamination layer is described in U.S. Pat. No. 6,372,609, incorporated herein by reference, and certain process details described in that patent may be applicable to the present technique.

Figure 9C:
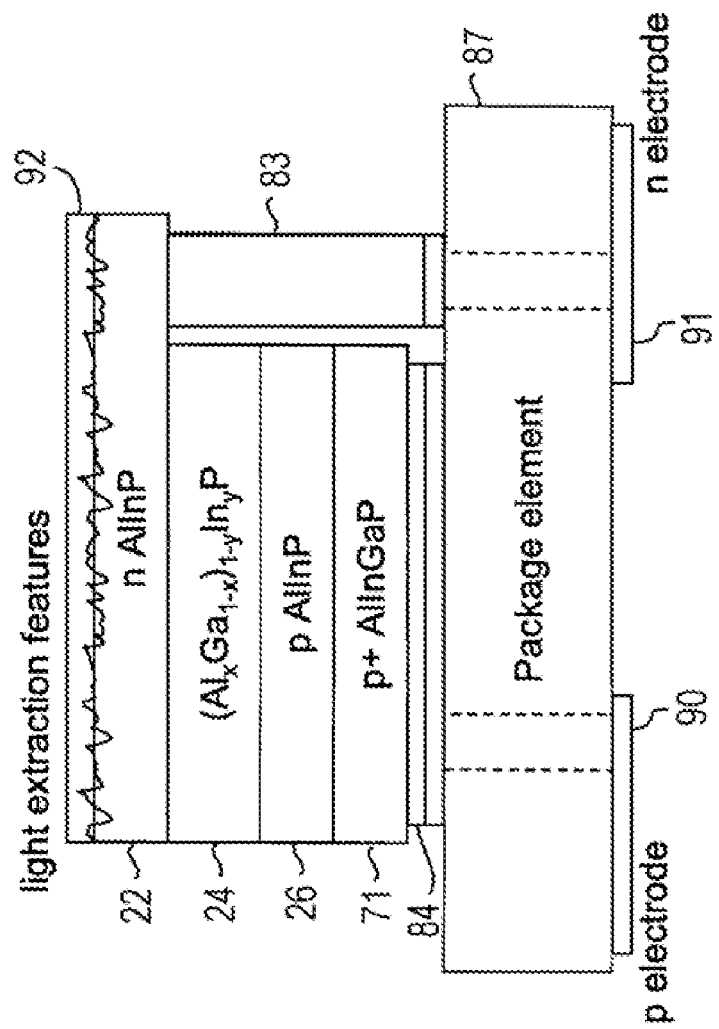

FIGS. 9A-9C illustrate how the LED structure can be formed as a flip chip, with both contacts on the same side. In FIG. 9A layers 24, 26, and 71 are etched to expose the n-AlInP confining layer 22 for electrical contact. A metal n-electrode 83 is then formed to electrically contact the n-AlInP confining layer 22, and a p-electrode 84 is formed to contact the p+ AlInGaP layer 71.

In FIG. 9B, the p and n-electrodes are bonded to metal pads 85 and 86, on the package element 87. The carrier substrate 66 and layers 68, 62, and 70 may be removed after bonding the electrodes to the package element 87. Vias 88, 89 electrically couple the pads 85, 86 to p and n-electrodes 90, 91 on the package element 87. Electrodes 90, 91 may be soldered to pads on a circuit board or to pads on another package.

In FIG. 9C, the top surface of the LED (the n-AlInP layer 22 in the example) is further processed to have light extraction features 92. Such features may include roughening or other techniques, such as ordered texturing or a photonic crystal structure, to increase the light output.

In all of the embodiments, a Distributed Bragg Reflector (DBR) stack may be formed within the LED structure to reflect light emitted by the active layer. For example, in FIGS. 7-9, a DBR stack, may be formed above or below the active layer 24, or below and above for a resonant cavity LED. The DBR is tuned to reflect the wavelength of emitted light.

The above-described processes are used to create less temperature sensitive AlInGaP LEDs emitting visible red light. The above techniques can also be used to produce AlInGaP LEDs emitting yellow to green light.

Although some examples presented herein specify a certain composition and lattice constant of the AlInGaP materials, such specified compositions and lattice constants are not required for the invention. For example, y may range from 0.48 to 0.66, and x may range from 0 to 1.0.

Figure 10:
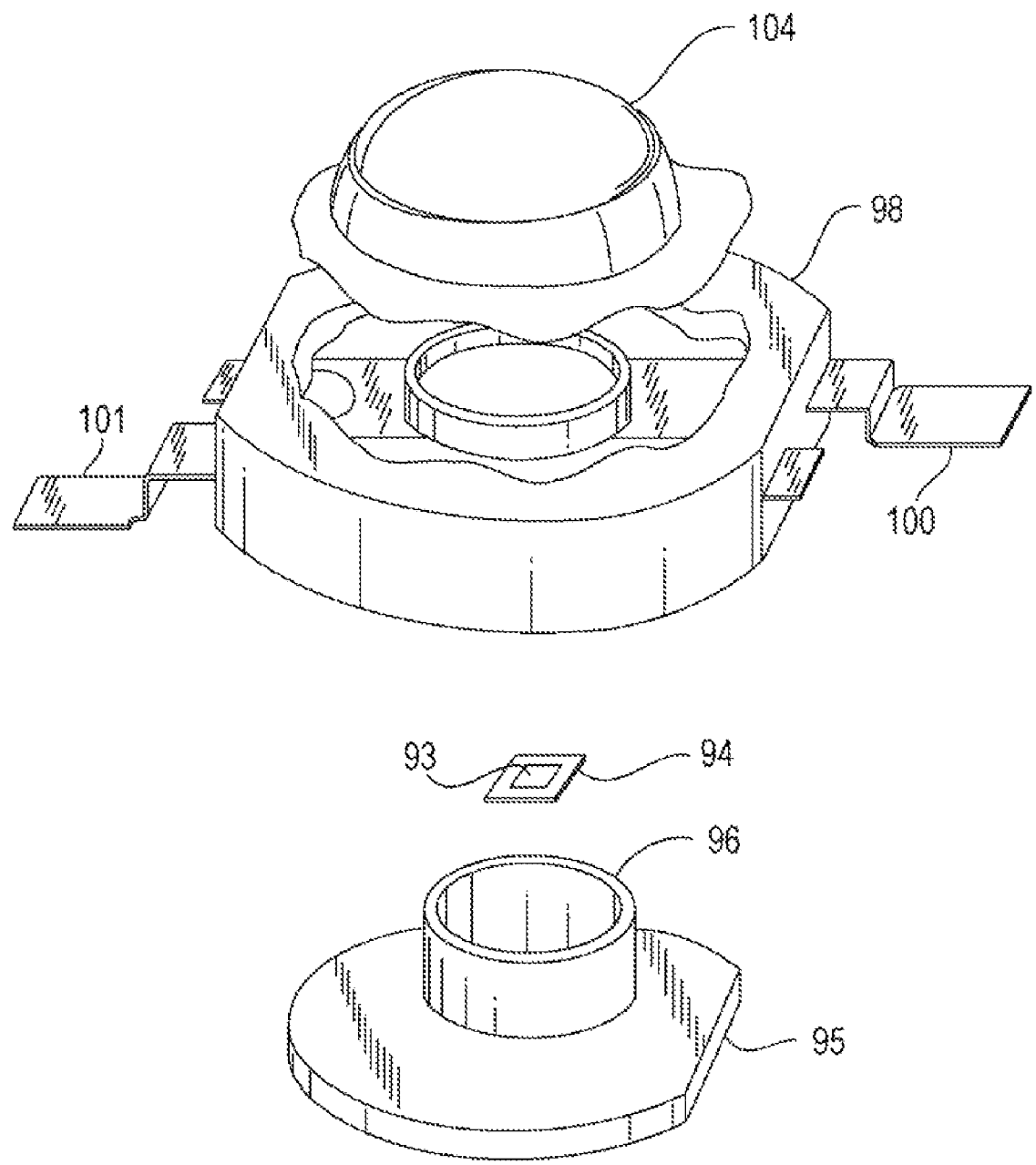
FIG. 10 is an exploded view of one embodiment of a package for the resulting LED.

The LED structures described above may be packaged in a surface mount package or in any other package. FIG. 10 is an exploded view of one embodiment of a surface mount package. An LED die 93 is mounted on a submount 94. A metal heat-sinking slug 95 and reflector cup 96 are placed into a molded leadframe 98. The molded leadframe 98 is, for example, a filled plastic material molded around metal leads 100, 101 that provide an electrical path to the p and n metal contacts on die 93. The bottom surface of submount 94 is bonded to slug 95. A wire (not shown) is bonded between the top p-metal of die 93 (assuming the LED is not a flip chip) and metal lead 100, and a wire (not shown) is bonded between the metal slug 95 and metal lead 101 for electrical connection to the n-layers. An optical lens 104 may be added. Slug 95 is exposed through the bottom of leadframe 98 so as to directly contact a heat sink on which the package is mounted, such as an electrically insulated aluminum circuit board.

Many other types of packages may be used.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A light emitting device comprising:
   a light emitting diode (LED) portion comprising:
   a first $(Al_xGa_{1-x})_{1-y}In_yP$ epitaxial layer of a first conductivity type formed on a growth layer, the growth layer having a lattice constant greater than that of GaAs;
   an active layer epitaxially grown over the first $(Al_xGa_{1-x})_{1-y}In_yP$ epitaxial layer, wherein the active layer comprises one or more layers of material comprising any combination of Al, Ga, In, and P, such that the active layer has a lattice constant greater than the lattice constant of GaAs and approximately equal to the lattice constant of the growth layer, and wherein the active layer emits visible light; and
   a second epitaxial layer of a second conductivity type grown over the active layer.

2. The device of claim 1 wherein $0 \leq x \leq 1.0$, and $y > 0.48$.

3. The device of claim 1 wherein the growth layer comprises an epitaxial layer formed on a graded InGaAs layer.

4. The device of claim 1 wherein the growth layer comprises an epitaxial layer formed on a graded InGaP layer.

5. The device of claim 1 wherein the growth layer comprises an epitaxial layer of InGaP or InGaAs grown over a GaAs substrate, where the InGaP or InGaAs layer was strained when overlying the GaAs substrate then relaxed to expand its lattice constant when released from the GaAs substrate.

6. The device of claim 1 wherein the active layer is not strained.

7. The device of claim 1 wherein the active layer is strained.

8. The device of claim 1 wherein the first epitaxial layer is an n-type confining layer, and the second epitaxial layer is a p-type confining layer.

9. The device of claim 1 wherein the first epitaxial layer is an AlInP confining layer, and the second epitaxial layer is an AlInP confining layer.

10. The device of claim 1 further comprising a reflective material overlying the second epitaxial layer.

11. The device of claim 1 further comprising a transparent window layer overlying the second epitaxial layer.

12. The device of claim 1 wherein the growth layer is an InGaP layer epitaxially grown over a GaAs substrate.

13. The device of claim 1 wherein the growth layer is an InGaAs layer epitaxially grown over a GaAs substrate.

14. The device of claim 1 wherein the device further comprises the growth layer.

15. The device of claim 1 wherein y equals approximately 0.53.

16. The device of claim 1 wherein the lattice constant of the active layer is greater than 5.66 Å.

17. The device of claim 1 wherein the lattice constant of the active layer is between 5.66 Å and 5.73 Å.

18. The device of claim 1 wherein the visible light is red light.

19. The device of claim 1 wherein the visible light is yellow light.

20. The device of claim 1 wherein the visible light is green light.

21. The device of claim 1 wherein the growth layer comprises an $In_xGa_{1-x}As$ epitaxial layer, where $0 < x < 0.18$.

22. The device of claim 1 wherein the growth layer comprises an $In_yGa_{1-y}P$ epitaxial layer, where $0.48 < y < 0.66$.

23. The device of claim 1 further comprising at least one intervening epitaxial layer between the first epitaxial layer and the active layer.

24. The device of claim 1 further comprising at least one intervening epitaxial layer between the active layer and the second epitaxial layer.

25. The device of claim 1 wherein the active layer has a first surface and an opposing second surface, the device further comprising a window layer formed opposing the first surface of the active layer and a bonded substrate opposing the second surface of the active layer.

26. The device of claim 1 further comprising:
   a substrate; and
   a reflector between the substrate and the active layer.

27. The device of claim 1 further comprising at least one reflector opposing at least one surface of the active layer.

* * * * *